US010446439B2

(12) United States Patent
Yashar et al.

(10) Patent No.: US 10,446,439 B2
(45) Date of Patent: Oct. 15, 2019

(54) LOW RESISTANCE INTERCONNECT

(71) Applicant: Intel Corporation, Santa Clara, CA (US)

(72) Inventors: Philip Yashar, Portland, OR (US); Gokul Malyavanatham, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 3 days.

(21) Appl. No.: 15/769,432

(22) PCT Filed: Dec. 26, 2015

(86) PCT No.: PCT/US2015/000370
§ 371 (c)(1),
(2) Date: Apr. 19, 2018

(87) PCT Pub. No.: WO2017/111814
PCT Pub. Date: Jun. 29, 2017

(65) Prior Publication Data
US 2018/0301373 A1    Oct. 18, 2018

(51) Int. Cl.
H01L 21/285       (2006.01)
H01L 23/532       (2006.01)
H01L 21/768       (2006.01)

(52) U.S. Cl.
CPC .... *H01L 21/76843* (2013.01); *H01L 21/2855* (2013.01); *H01L 21/76877* (2013.01); *H01L 23/53238* (2013.01); *H01L 21/76871* (2013.01)

(58) Field of Classification Search
CPC .......... H01L 21/76843; H01L 21/2855; H01L 23/53238
See application file for complete search history.

(56) References Cited

U.S. PATENT DOCUMENTS

| 6,743,473 B1 | 6/2004 | Parkhe et al. |
| 8,981,481 B2 | 3/2015 | Hafez et al. |
| 9,184,294 B2 | 11/2015 | Cea et al. |
| 2003/0085470 A1 | 5/2003 | Hasunuma |
| 2005/0233159 A1* | 10/2005 | Fartash ............... B41J 2/14129 428/457 |

(Continued)

FOREIGN PATENT DOCUMENTS

| JP | 2001326198 A | 11/2001 |
| JP | 2002305198 A | 10/2002 |
| JP | 2003168661 A | 6/2003 |

OTHER PUBLICATIONS

The International Searching Authority, Written Opinion of the International Searching Authority and the International Search Report dated Aug. 24, 2016 in International Application No. PCT/US2015/000373, eight pages.

(Continued)

*Primary Examiner* — Elias Ullah
(74) *Attorney, Agent, or Firm* — Trop, Pruner & Hu, P.C.

(57) ABSTRACT

An embodiment includes an apparatus comprising: a transistor formed on a substrate; and a metal interconnect formed in a dielectric layer above the transistor, wherein: the interconnect comprises a copper layer and a barrier layer that separates the copper layer from the dielectric layer, and the barrier layer comprises tantalum and niobium. Other embodiments are described herein.

18 Claims, 6 Drawing Sheets

(56) References Cited

U.S. PATENT DOCUMENTS

| | | | |
|---|---|---|---|
| 2010/0102449 A1* | 4/2010 | Ikeda | H01L 21/76831 257/751 |
| 2012/0012935 A1 | 1/2012 | Kaneko et al. | |
| 2012/0205742 A1 | 8/2012 | Iyer et al. | |
| 2013/0221317 A1* | 8/2013 | Pramanik | H01L 45/04 257/5 |
| 2014/0203376 A1 | 7/2014 | Xie et al. | |
| 2015/0179770 A1 | 6/2015 | Hong et al. | |

OTHER PUBLICATIONS

Shy et al., "Superconducting properties, electrical resistivities, and structure of NbN thin films," Journal of Applied Physics, 1973, pp. 5539-5545, vol. 44, No. 12, American Institute of Physics.

Jiang et al., "Influence of Nitrogen Content in WNx on Its Thermal Stability and Electrical Property as a Gate Electrode," Journal of the Electrochemical Society, 2006, vol. 153, Issue 6, pp. G572-G577.

Noya et al., "Diffusion-barrier properties of Ta1-xWx alloy films and silicidation-induced Cu penetration in Cu/Si contacts," Journal of Vacuum Science and Technology B, Jan.-Feb. 2005, pp. 280-287, vol. 23, No. 1, American Vacuum Society.

The International Searching Authority, Written Opinion of the International Searching Authority and the International Search Report dated Sep. 26, 2016 in International Application No. PCT/US2015/000370, 12 pages.

Holec et al, "Trends in the elastic response of binary early transition metal nitrides," Physical Review B, 2012, pp. 064101-1 to 064101-9, vol. 85, American Physical Society.

Jang et al., "Tantalum and niobium as diffusion barrier between copper and silicon," Journal of Materials Science: Materials In Electronics 7, 1996, pp. 271-278, Chapman & Hall.

Komiyama et al, "Growth and field crystallization of anodic films on Ta—Nb alloys," Journal of Solid State Electrochemistry, 2012, pp. 1595-1604, vol. 16, Springer.

Lee et al., "Characterization of niobium, tantalum and chromium sputtered coatings on steel using eddy currents," Surface & Coatings Technology, 2005, pp. 2547-2556, vol. 200, Elsevier B.V.

* cited by examiner

| Element | Miscible with Ta | Immiscible with Cu | Lattice parameter (Å) | Resistivity (µOhm-cm) | MN Resistivity (µOhm-cm) |
|---|---|---|---|---|---|
| V | No | Yes | 3.02 | 20.1 | |
| Cr | No | Yes | 2.88 | 12.6 | |
| Fe | No | Yes | 2.87 | 9.9 | |
| Nb | Yes | Yes | 3.30 | 15.2 | ~50 |
| Mo | Yes | Yes | 3.15 | 5.5 | |
| W | Yes | Yes | 3.16 | 5.4 | 225-400 |
| Ta | NA | Yes | 3.30 | 13.4 (bcc) ~190 (tetragonal) | ~250 |

FIG. 1

| Element | Metal $E_Y$ (GPa) | Nitride $E_Y$ (GPa) | Thermal Expansion Coeff ($10^{-6}$ K$^{-1}$) |
|---|---|---|---|
| Nb | 105 | ~325-480 | 7.3 |
| Mo | 329 | | 4.8 |
| W | 411 | | 4.5 |
| Ta | 186 | 400-600 | 6.3 |
| Al shielding | | | 23.1 |

FIG. 2

LOW RESISTANCE INTERCONNECT

TECHNICAL FIELD

Embodiments of the invention are in the field of semiconductor devices and, in particular, interconnects.

BACKGROUND

Once semiconductor wafers are prepared, a large number of process steps are still necessary to produce desired semiconductor integrated circuits. In general the steps can be grouped into four areas: Front End Processing, Back End Processing, Test, and Packaging.

Front End Processing refers to the initial steps in the fabrication. In this stage the actual semiconductor devices (e.g., transistors) are created. A typical front end process includes: preparation of the wafer surface, patterning and subsequent implantation of dopants to obtain desired electrical properties, growth or deposition of a gate dielectric, and growth or deposition of insulating materials to isolate neighboring devices.

Once the semiconductor devices have been created they must be interconnected to form the desired electrical circuits. This "Back End Processing" involves depositing various layers of metal and insulating material in the desired pattern. Typically the metal layers consist of aluminum, copper, and the like. The insulating material may include SiO2, low-K materials, and the like. The various metal layers are interconnected by interconnects, which may include a line portion and a via portion. Vias may be formed by etching holes in the insulating material and depositing metal (e.g., Tungsten) in them. The line portion may be formed by etching trenches in the insulating material and depositing metal in them.

Once the Back End Processing has been completed, the semiconductor devices are subjected to a variety of electrical tests to determine if they function properly. Finally, the wafer is cut into individual die, which are then packaged in packages (e.g., ceramic or plastic packages) with pins or other connectors to other circuits, power sources, and the like.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

FIG. 1 includes characteristics of metals used in Ta-based alloys in embodiments;

FIG. 2 includes characteristics of metals used in Ta-based alloys in embodiments;

DETAILED DESCRIPTION

Figure 3:
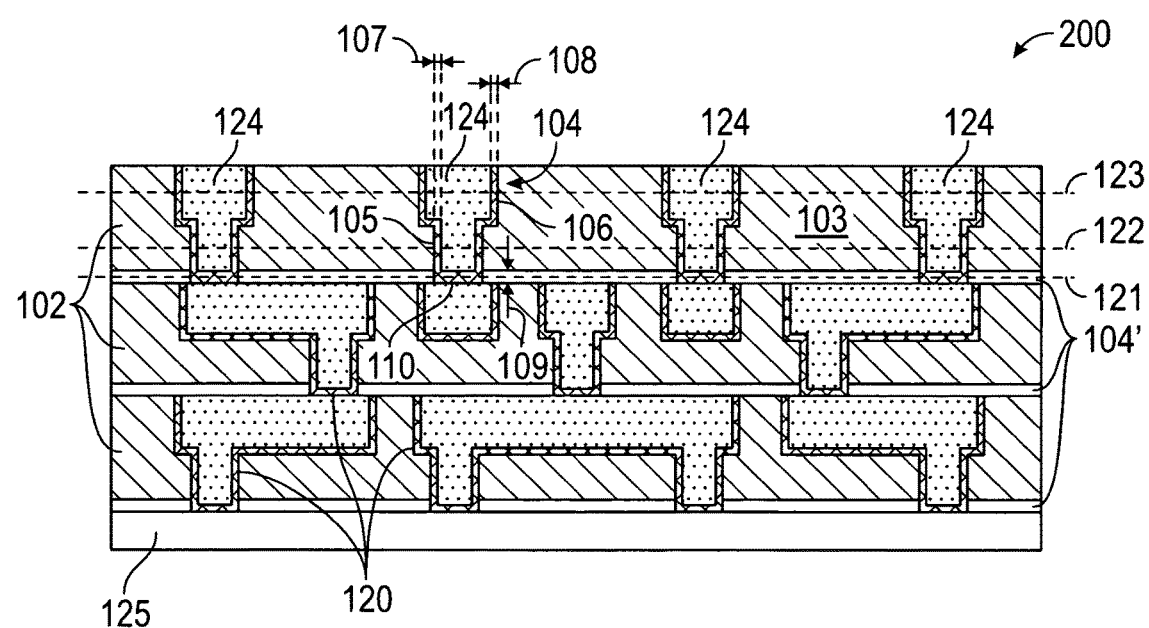
FIG. 3 includes Tantalum-Niobium based barrier layers in an embodiment.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Barrier films made from Tantalum Nitride (TaN), just Ta, or layers (e.g., alternating layers) including both TaN and Ta, are sometimes deposited by physical vapor deposition (PVD) as barrier films for interconnects that are to be filled with copper (Cu). Due to the nature of PVD deposition techniques the Ta-based barrier film is typically very thick at the bottom of trenches and vias. This is due to the non-conformal nature of PVD sputtering.

Specifically, PVD describes a variety of vacuum deposition methods which can be used to produce thin films. PVD uses physical process (such as heating or sputtering) to produce a vapor of material, which is then deposited on the object which requires coating. A PVD film is "non-conformal" and is deposited in a direction manner (and the bottom of interconnect is less shielded than sidewalls of the interconnect and therefore receives more the sputtered material). In contrast, atomic layer deposition (ALD) is a thin film technology that applies conformal thin films on various shapes and geometries. ALD films (or even chemical vapor deposition (CVD) films) are not necessarily thicker in the bottom of a trench because they grow at equal rates from the bottoms and sides of trenches and vias.

Thus, PVD films have increased resistivity due to the thickness of their deposits at the bottoms of interconnects. Furthermore, PVD Ta films tend to be deposited in a metastable tetragonal crystal structure. In crystallography, the tetragonal crystal system is one of the 7 lattice point groups. Tetragonal crystal lattices result from stretching a cubic lattice along one of its lattice vectors, so that the cube becomes a rectangular prism with a square base (a by a) and height (c, which is different from a). This crystal structure has a very high resistivity (180-200 micro-Ohm-cm). The crystal structure also contributes to the resistivity of the interconnect.

As a result of the thickness and crystal structure of most Ta-based barrier films, such films can contribute more than 50% of via resistance and more than 20% of line resistance in an interconnect circuit.

Conventionally, the solution to highly resistive Ta-based barrier films is to perform an etch step after the barrier film is deposited to minimize the thickness of the barrier film at the bottom of the vias and trenches. However, this may then need to be followed by a final thin deposition of Ta after the etch step to ensure any surfaces that may have been exposed during the etch step are covered with barrier material. Regardless, the Ta film typically remains in the high resistance phase (tetragonal crystal structure) and therefore presents undesirable highly resistive interconnects.

Further, attempts to minimize the thickness of the Ta-based film inside the Cu interconnect often requires the use of expensive hardware (e.g., adding an RF coil to the PVD chamber to enable an etch process and/or using high frequency RF power sources which require extensive RF shielding) and makes controlling the process challenging.

However, an embodiment addresses the problem of high via and line resistance due to Ta-based barrier films in Cu interconnects. Such an embodiment modifies the crystal structure of the Ta, thereby lowering the electrical resistivity of the Ta0 based film. Specifically, the modification promotes conversion of the Ta in the barrier film from tetragonal to a body-centered cubic (BCC) system that has one lattice point in the center of the unit cell in addition to the eight corner points. It has a net total of 2 lattice points per unit cell ($\frac{1}{8} \times 8 + 1$). The BCC structures provides a much lower resistivity (20-40 micro-Ohm-cm) than the tetragonal structure (180-200 micro-Ohm-cm). Such an embodiment not only reduces the resistivity of the barrier film but does so without modifying equipment or conventional process control methodologies.

An embodiment adds an alloying element to the Ta-based film to stabilize the low resistance bcc phase of Ta. Such elements, in various embodiments, include metals with one or more of the following characteristics: (1) BCC structure (e.g., V, Cr, Fe, Nb, Mo, W), (2) completely miscible with Ta (e.g., Nb, Mo, W), (3) immiscible with Cu (V, Cr, Fe, Nb, Mo, W) (4) low resistivity, and/or (5) a lattice parameter that is well matched to that of BCC-Ta (BCC-Ta has a 3.30 Å lattice parameter). See FIG. 1. Thus, embodiments include alloy elements (to be combined with Ta) including metals such as V, Cr, Fe, Nb, Mo, and/or W. As used herein, "MN resistivity" refers to the metal-nitride resistivity (e.g., NbN).

Embodiment may also be selected based on the ability of the film to be deposited without flaking issues from vacuum chambers walls. Specifically, PVD sputter deposition provides a glow plasma discharge (usually localized around the "target" plate of Ta by a magnet) within an Argon filled chamber that bombards the target material sputtering some away as a vapor for subsequent deposition. The sputtered material often comes in contact with shields in the chamber, such as aluminum (Al) shields. Some materials, such as W, may have undesirable traits in that they may "flake" off the Al shields and onto wafers, resulting in shorts and lower product yields. Flaking is influenced by the delta in thermal expansion coefficients between the film material and the shielding (e.g., Al shields) and the Young's modulus of the film material. See FIG. 2. For example, the environment in the vacuum chamber experiences temperature conditions so that materials such as W, which have relatively low thermal expansions and are relatively stiff, are more likely to decouple from shielding with different thermal expansion/module values. This decoupling (e.g., flaking) results in the lower aforementioned yields. For example, the chamber experiences variations between 100-200 degrees C., depending on plasma power conditions, which can lead to flaking.

FIG. 3 illustrates a cross-section 200 of a portion of an IC structure with metal interconnects according to an embodiment of the present invention. A stack of dielectric layers 102 includes metal interconnects having PVD layers (collectively shown as layers 120) and fill layers 124, such as Cu fill. The PVD layers 120 include Ta-based alloys (e.g., Ta—Nb alloys addressed herein) and are greatly simplified. The portion of the IC structure shown in FIG. 3 can be a portion of a back end of line (BEOL) metallization structure as found, for example, in a microprocessor die or memory die.

Further, embodiments such as the embodiment of FIG. 3 depict interconnects having a single opening. Such an opening may be formed using a damascene process. However, other openings have a stepped sidewall (such as a trench formed directly over a via), as is common in a dual damascene process. The opening or openings may be fabricated in dielectric layer 102 by well-known lithography and etch processing techniques typically used in damascene and dual damascene type fabrication. Although only three dielectric layers 102 are depicted, many more layers of the same or differing dielectric materials may instead be used. Additionally, in an embodiment the dielectric layers 102 are formed on etch stop layers 104' disposed on a substrate. The etch stop layer may be composed of a material such as silicon nitride or silicon oxynitride. Other layers like seed layers and the like may be included but not necessarily shown in FIG. 3.

As used herein, the term micro-Ohm-cm refers to the measurement of the "volume" resistivity (also known as "bulk" resistivity) of a semiconductive material. The value in micro-Ohm-cm is the inherent resistance of a given material regardless of the shape or size.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

Returning to FIG. 3, apparatus 200 comprises via layers 102, each including a dielectric 103, between a substrate 125 and a metal layer (not shown); and a transistor (not shown) included in the substrate. Apparatus 200 includes interconnects, included in the via layers 102, each coupling various layers together (e.g., a metal layer to a transistor in substrate 125). Any of the interconnects include copper 124 and a barrier layer 120 that couples (directly or indirectly) the copper to the dielectric of the via layers 102. For ease of explanation, interconnect 104 is addressed. The barrier layer 120 is (a) on a first sidewall 105 of the interconnect at a horizontal thickness 107, (b) on a second sidewall 106 of the interconnect at an additional horizontal thickness 108, and (c) along a bottom 110 of the interconnect at a vertical thickness 109 that is greater than the horizontal thickness 107.

The bottommost portion of the barrier layer in device 200 defines the bottom of the interconnect and more specifically, the bottommost portion of the bottom portion of the interconnect. This portion may or may not align vertically with the bottom most portions of the sidewalls of the interconnect. For example, the bottom most edge of the barrier layer may be slightly below the bottom most edge of the dielectric walls of the interconnect.

Barrier layer 120 includes an alloy including tantalum and niobium. As used herein, an alloy is a metal made by combining two or more metallic elements. In an embodiment both the tantalum and the niobium have a BCC crystal structure. Substrate 125 includes silicon.

In an embodiment, barrier layer 120 is sputtered (e.g., PVD sputtered) within interconnect 104. Barrier layer 120 is not a conformal thin film (e.g., CVD or ALD). Such conformal films conforms, if employed in place of layer 120, would conform in equal thicknesses along the first and second sidewalls 105, 106 and the bottom 110 of the interconnect.

For barrier layer 120 the tantalum and niobium are completely miscible with each other. They are each BCC.

Embodiments provide wherein the alloy of layer 120 includes at least 25% niobium but other embodiments provide 35, 45, 55, 65, 75, 85, or 95% niobium.

A first horizontal axis 121, parallel to the substrate 125, intersects the barrier layer 120 along the bottom 110 of the interconnect but does not intersect the copper 124. A second horizontal axis 122 intersects the barrier layer 120 on the first and second sidewalls 105, 106 of the interconnect 104, and the copper 124 but does not intersect the barrier layer along the bottom 110 of the interconnect.

The barrier layer along the bottom of the interconnect has the vertical thickness 109 that intersects the first horizontal axis 121. The barrier layer along one of the sidewalls has the horizontal thickness 107 that intersects the second horizontal axis 122. The vertical thickness 109 is greater than the horizontal thickness 107. Thickness 109 may be 2-10 nm and thickness 107 may be 1-4 nm in various embodiments.

In an embodiment, barrier layer 120 alloy has a volume resistivity less than 35 micro-Ohm-cm. However, in other embodiments the resistivity may be less than 20, 30, 40, 45, 50, 55, 60, 65, 70, 80, 90, or 100 micro-Ohm-cm.

In an embodiment via resistance is the sum of the resistance of the Cu fill and the barrier layer, and can be calculated using the following equation:

$$R = \frac{4}{\pi D^2} \times [(\rho_{Cu} \times \text{Via height}) + (\rho_{barrier} \times \text{Barrier thickness})]$$

where ρ is the resistivity of the material and D is the diameter of the via. For example, for a perfectly vertical via (e.g., the via portion below the trench portion in interconnect 104) with a critical dimension (CD) (i.e., dimension of the smallest geometrical features, such as width of an interconnect line, that can be formed during semiconductor device/circuit manufacturing using a given technology) of 25 nm and a height of 50 nm and a Ta barrier of 5 nm in thickness (e.g., thickness 109) at the bottom of the via, the calculated via resistance is about 23 Ohms (of which the barrier layer contributes about 19 Ohms to this total). Reducing the thickness of the Ta based barrier film helps, but reducing the resistivity of the barrier material has far more potential benefit to via resistance.

For example, since both BCC-Ta and BCC-Nb have resistivities less than or about 15 micro-Ohm-cm, their alloy has a resistivity of less than or about 30 micro-Ohm-cm (depending on how much Nb is used in the alloy). Using the same dimensions as the above calculation but with a barrier film resistivity of 30 micro-Ohm-cm, the via has a resistance of about 7 Ohms for about a 70% reduction in via resistance.

As shown in FIG. 3, interconnect 104 includes a trench formed directly over a via. Sidewalls of the interconnect may be considered those intersected by axis 122 and/or axis 123. Thus, a sidewall may refer to a trench sidewall and/or a via sidewall.

Figure 6:
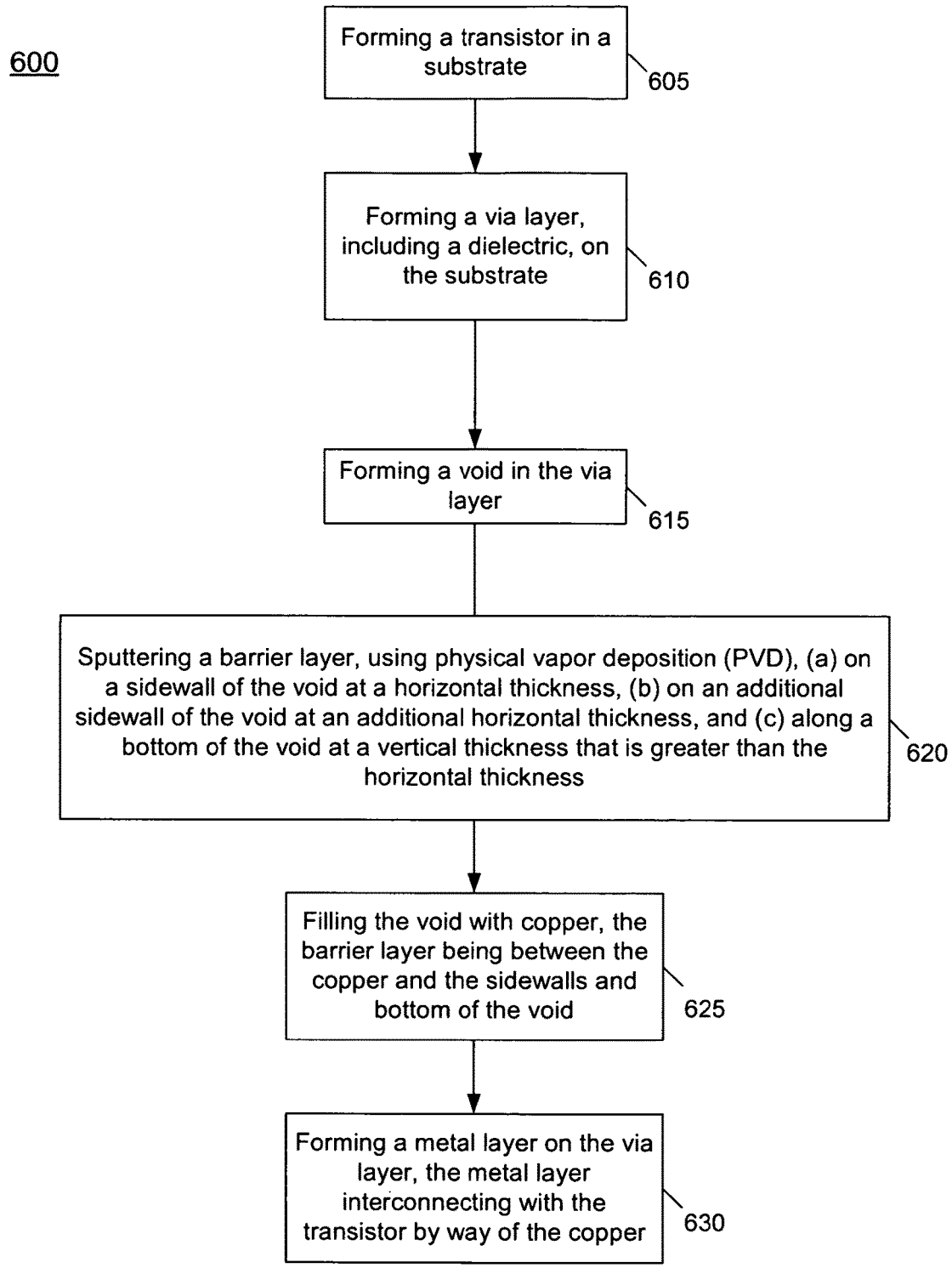
FIG. 6 includes a process in an embodiment.

FIG. 6 includes a process 600 in an embodiment. Block 605 includes forming a transistor in a substrate. Block 610 includes forming a via layer, including a dielectric, on the substrate. Block 615 includes forming a void in the via layer. Block 620 includes sputtering a barrier layer, using physical vapor deposition (PVD), (a) on a sidewall of the void at a horizontal thickness, (b) on an additional sidewall of the void at an additional horizontal thickness, and (c) along a bottom of the void at a vertical thickness that is greater than the horizontal thickness. With process 600 using PVD sputtering, a substantial barrier to Cu is formed. Such a barrier may not be possible with other methods such as CVD or ALD (such films would have to be too thick to form an adequate Cu barrier), thereby removing those methods from consideration for various real world embodiments that must be reliable when scaled for mass production. Block 625 includes filling the void with copper, the barrier layer being between the copper and the sidewalls and bottom of the void. Block 630 includes forming a metal layer on the via layer, the metal layer interconnecting with the transistor by way of the copper. In process 600 the barrier layer includes an alloy including tantalum and niobium.

Figure 4:
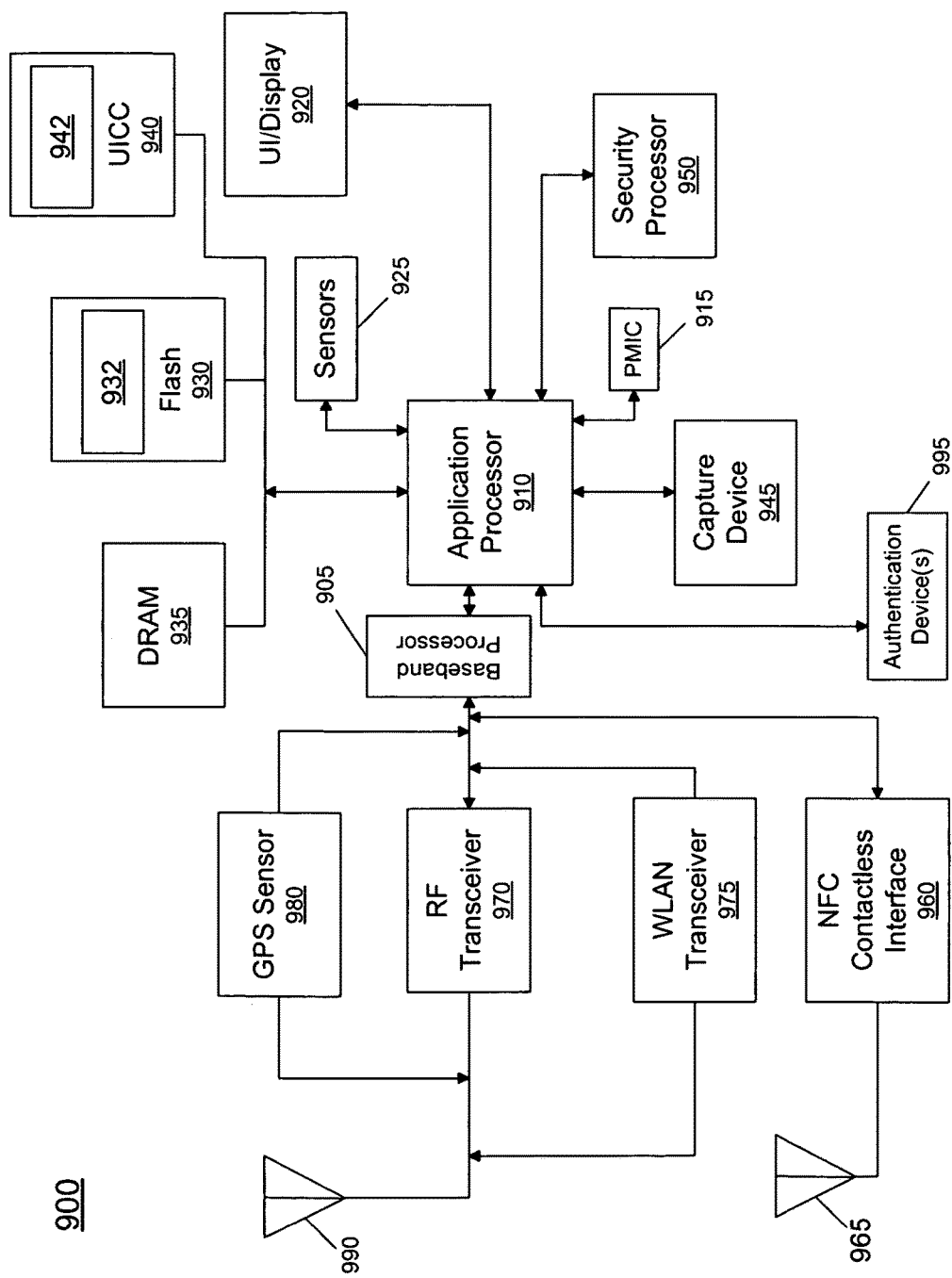
FIGS. 4-5 include systems that include the barrier layer embodiments described herein.

Referring now to FIG. 4, shown is a block diagram of an example system with which embodiments can be used. As seen, system 900 may be a smartphone or other wireless communicator or any other IoT device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 5:
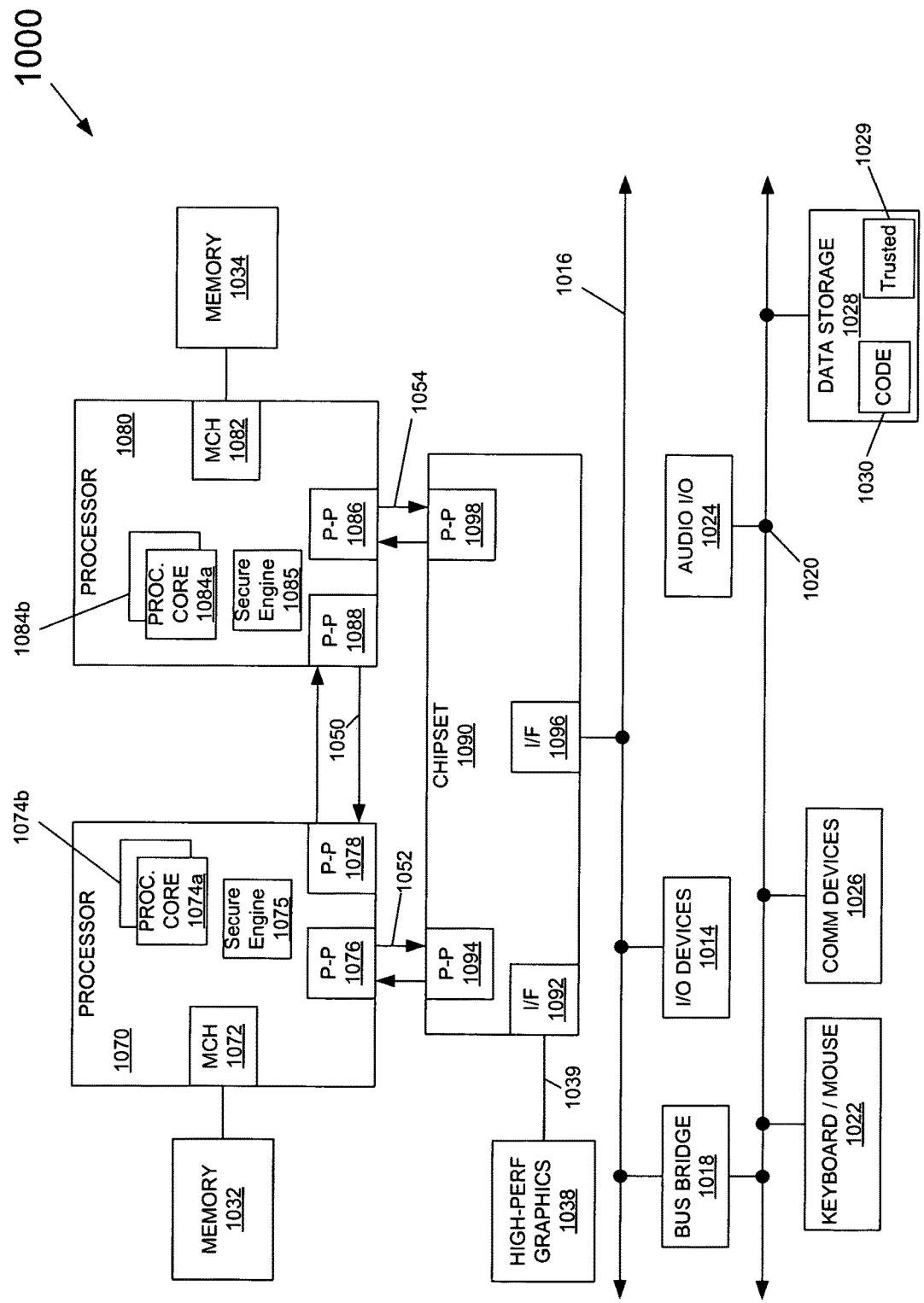

Referring now to FIG. 5, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs, including first and second processor cores (i.e., processor cores 1074*a* and 1074*b* and processor cores 1084*a* and 1084*b*), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Embodiments may include barrier films processed according to embodiments described herein. Such barrier films may be included in, for example, processor 910, 1070 and/or memory 935, 932, 1032, 1034, 1028. Such barrier films may be included in a system on a chip (SoC) with embedded memory including a memory array comprising interconnects with TaNb alloy barrier films.

The following examples pertain to further embodiments.

Example 1 includes an apparatus comprising: a via layer, including a dielectric, between a substrate and a metal layer; and a transistor included in the substrate; and an interconnect, included in the via layer, coupling the metal layer to the transistor; wherein: the interconnect includes copper and a barrier layer that couples the copper to the dielectric; the barrier layer is: (a) on a first sidewall of the interconnect at a horizontal thickness, (b) on a second sidewall of the interconnect at an additional horizontal thickness, and (c) along a bottom of the interconnect at a vertical thickness that is greater than the horizontal thickness; and the barrier layer includes an alloy including tantalum and niobium.

In example 2 the subject matter of the Example 1 can optionally include wherein both the tantalum and the niobium have a body centered cubic (BCC) crystal structure.

In example 3 the subject matter of the Examples 1-2 can optionally include wherein the substrate includes silicon.

In example 4 the subject matter of the Examples 1-3 can optionally include wherein the barrier layer is sputtered within the interconnect.

In example 5 the subject matter of the Examples 1-4 can optionally include wherein the barrier layer is a physical vapor deposition (PVD) layer sputtered within the interconnect.

In example 6 the subject matter of the Examples 1-5 can optionally include wherein the barrier layer is not a conformal thin film that conforms in equal thicknesses along the first and second sidewalls and the bottom of the interconnect.

In example 7 the subject matter of the Examples 1-6 can optionally include wherein the tantalum and niobium are completely miscible with each other.

In example 8 the subject matter of the Examples 1-7 can optionally include wherein the alloy includes at least 5% niobium.

In example 9 the subject matter of the Examples 1-8 can optionally include wherein: a first horizontal axis, parallel to the substrate, intersects the barrier layer along the bottom of the interconnect but does not intersect the copper; a second horizontal axis intersects the barrier layer on the first and second sidewalls of the interconnect, and the copper but does not intersect the barrier layer along the bottom of the interconnect; the barrier layer along the bottom of the interconnect has the vertical thickness that intersects the first horizontal axis; the barrier layer along one of the sidewalls has the horizontal thickness that intersects the second horizontal axis; and the vertical thickness is greater than the horizontal thickness.

In example 10 the subject matter of the Examples 1-9 can optionally include wherein the alloy has a volume resistivity less than 35 mico-Ohm-cm.

In example 11 the subject matter of the Examples 1-10 can optionally include system on a chip with embedded memory including a memory array comprising the interconnect.

In example 12 the subject matter of the Examples 1-11 can optionally include wherein: the interconnect includes a trench formed directly over a via; the first and second sidewalls are, included completely within the via; the bottom of the interconnect is included within the via.

Example 13 includes a method comprising: forming a transistor in a substrate; forming a via layer, including a dielectric, on the substrate; forming a void in the via layer; sputtering a barrier layer, using physical vapor deposition (PVD), (a) on a sidewall of the void at a horizontal thickness, (b) on an additional sidewall of the void at an additional horizontal thickness, and (c) along a bottom of the void at a vertical thickness that is greater than the horizontal thickness; filling the void with copper, the barrier layer being between the copper and the sidewalls and bottom of the void; and forming a metal layer on the via layer, the metal layer interconnecting with the transistor by way of the copper; wherein the barrier layer includes an alloy including tantalum and, niobium.

In example 14 the subject matter of the Example 13 can optionally include wherein both the tantalum and the niobium have a body centered cubic (BCC) crystal structure.

In example 15 the subject matter of the Examples 13-14 can optionally include wherein the tantalum and niobium are completely miscible with each other.

Example 16 includes an apparatus comprising: a via layer, including a dielectric, between a substrate and a metal layer; and an interconnect included in the via layer and coupled to the metal layer; wherein: the interconnect includes copper and a barrier layer that couples the copper to the dielectric; the barrier layer is (a) on a first sidewall of the interconnect at a horizontal thickness, and (b) along a bottom of the interconnect at a vertical thickness that is greater than the horizontal thickness; and the barrier layer includes an alloy including Tantalum and an element that includes at least one of Niobium, Tungsten, and Molybdenum.

In example 17 the subject matter of the Example 16 can optionally include wherein both the tantalum and the element have a body centered cubic (BCC) crystal structure.

In example 18 the subject matter of the Examples 16-17 can optionally include wherein the barrier layer is sputtered within the interconnect.

In example 19 the subject matter of the Examples 16-18 can optionally include wherein the alloy includes at least 5% niobium.

In example 20 the subject matter of the Examples 16-19 can optionally include wherein: the interconnect includes a trench formed directly over a via; the first sidewall is included completely within the via; the bottom of the interconnect is included within the via.

Example 21 includes an apparatus comprising: a via layer, including a dielectric, between a substrate and a metal layer; and a transistor included in the substrate; and an interconnect, included in the via layer, coupling the metal layer to the transistor; wherein: the interconnect includes copper and a barrier layer that couples the copper to the dielectric; the barrier layer is (a) on a first sidewall of the interconnect at a horizontal thickness, (b) on a second sidewall of the interconnect at an additional horizontal thickness, and (c) along a bottom of the interconnect at a vertical thickness that is greater than the horizontal thickness; and the barrier layer includes an alloy including tantalum and niobium.

Example 1a includes an apparatus comprising: a transistor formed on a substrate; and a metal interconnect formed in a dielectric layer above the transistor, wherein: the interconnect comprises a copper layer and a barrier layer that separates the copper layer from the dielectric layer, and the barrier layer comprises tantalum and niobium.

In example 2a the subject matter of Example 1a can optionally include wherein both the tantalum and the niobium have a body centered cubic (BCC) crystal structure.

In example 3a the subject matter of Examples 1a-2a can optionally include wherein the substrate includes silicon.

In example 4a the subject matter of Examples 1a-3a can optionally include the barrier layer is: (a) on a sidewall of the interconnect at a horizontal thickness, and (c) along a bottom of the interconnect at a vertical thickness that is greater than the horizontal thickness.

In example 5a the subject matter of Examples 1a-4a can optionally include wherein the barrier layer is a physical vapor deposition (PVD) layer sputtered within the interconnect.

In example 6a the subject matter of Examples 1a-5a can optionally include wherein the barrier layer is not a conformal thin film that conforms in equal thicknesses along the first and second sidewalls and the bottom of the interconnect.

In example 7a the subject matter of Examples 1a-6a can optionally include wherein the tantalum and the niobium are completely miscible with each other.

In example 8a the subject matter of Examples 1a-7a can optionally include wherein the barrier layer includes at least 5% niobium.

In example 9a the subject matter of Examples 1a-8a can optionally include wherein: a first horizontal axis, parallel to the substrate, intersects the barrier layer along a bottom of the interconnect but does not intersect the copper; a second horizontal axis intersects the barrier layer, on first and second sidewalls of the interconnect, and the copper but does not intersect the barrier layer along the bottom of the interconnect; the barrier layer, along the bottom of the interconnect, has a vertical thickness that intersects the first horizontal axis; the barrier layer along one of the sidewalls has a horizontal thickness that intersects the second horizontal axis; and the vertical thickness is greater than the horizontal thickness.

In example 10a the subject matter of Examples 1a-9a can optionally include wherein the barrier layer has a volume resistivity less than 35 mico-Ohm-cm.

In example 11a the subject matter of Examples 1a-10a can optionally include a system on a chip with embedded memory including a memory array comprising the interconnect.

In example 12a the subject matter of Examples 1a-11a can optionally include wherein: the interconnect includes a trench formed directly over a via; first and second sidewalls of the interconnect are included completely within the via; the bottom of the interconnect is included within the via.

Example 13a includes a method comprising: forming a via layer, including a dielectric, on a substrate; forming a void in the via layer; sputtering a barrier layer, using physical vapor deposition (PVD), in the void; and filling the void with copper, the barrier layer separating the copper from the dielectric wherein the barrier layer comprises tantalum and niobium.

In example 14a the subject matter of Example 13a can optionally include wherein both the tantalum and the niobium have a body centered cubic (BCC) crystal structure.

In example 15a the subject matter of Examples 13a-14a can optionally include wherein the tantalum and niobium are completely miscible with each other.

In example 16a the subject matter of Examples 13a-15a can optionally include wherein sputtering the barrier layer comprises sputtering the barrier layer (a) on a sidewall of the void at a horizontal thickness, and (b) along a bottom of the void at a vertical thickness that is greater than the horizontal thickness.

Example 17a includes An apparatus comprising: a via layer, including a dielectric, between a substrate and a metal layer; and an interconnect included in the via layer and coupled to the metal layer; wherein: the interconnect includes copper and a barrier layer that separates the copper from the dielectric; the barrier layer is (a) on a first sidewall of the interconnect at a horizontal thickness, and (b) along a bottom of the interconnect at a vertical thickness that is greater than the horizontal thickness; and the barrier layer includes an alloy including Tantalum and an element that includes at least one of Niobium, Tungsten, and Molybdenum.

In example 18a the subject matter of Example 17a can optionally include wherein both the tantalum and the element have a body centered cubic (BCC) crystal structure.

In example 19a the subject matter of Examples 17a-18a can optionally include wherein the barrier layer is sputtered within the interconnect.

In example 20a the subject matter of Examples 17a-19a can optionally include wherein the alloy includes at least 5% niobium.

In example 21a the subject matter of Examples 17a-20a can optionally include wherein: the interconnect includes a trench formed directly over a via; the first sidewall is included completely within the via; the bottom of the interconnect is included within the via.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
a transistor formed on a substrate; and
a metal interconnect formed in a dielectric layer above the transistor, wherein:
the interconnect comprises a copper layer and a barrier layer that separates the copper layer from the dielectric layer, and
the barrier layer comprises tantalum and niobium.

2. The apparatus of claim 1, wherein both the tantalum and the niobium have a body centered cubic (BCC) crystal structure.

3. The apparatus of claim 1, wherein the substrate includes silicon.

4. The apparatus of claim 1, wherein the barrier layer is: (a) on a sidewall of the interconnect at a horizontal thickness, and (c) along a bottom of the interconnect at a vertical thickness that is greater than the horizontal thickness.

5. The apparatus of claim 1, wherein the barrier layer is a physical vapor deposition (PVD) layer sputtered within the interconnect.

6. The apparatus of claim 1, wherein the barrier layer is not a conformal thin film that conforms in equal thicknesses along first and second sidewalls and a bottom of the interconnect.

7. The apparatus of claim 1, wherein the tantalum and the niobium are completely miscible with each other.

8. The apparatus of claim 1, wherein the barrier layer includes at least 5% niobium.

9. The apparatus of claim 1, wherein:
a first horizontal axis, parallel to the substrate, intersects the barrier layer along a bottom of the interconnect but does not intersect the copper;
a second horizontal axis intersects the barrier layer, on first and second sidewalls of the interconnect, and the copper but does not intersect the barrier layer along the bottom of the interconnect;
the barrier layer, along the bottom of the interconnect, has a vertical thickness that intersects the first horizontal axis;
the barrier layer along at least one of the first or second sidewalls has a horizontal thickness that intersects the second horizontal axis; and
the vertical thickness is greater than the horizontal thickness.

10. The apparatus of claim 1, wherein the barrier layer has a volume resistivity less than 35 micro-Ohm-cm.

11. The apparatus of claim 1 including a system on a chip with embedded memory including a memory array comprising the interconnect.

12. The apparatus of claim 1, wherein:
the interconnect includes a trench formed directly over a via;
first and second sidewalls of the interconnect are included completely within the via;
a bottom of the interconnect is included within the via.

13. The apparatus of claim 1, wherein the barrier layer directly contacts the dielectric layer.

14. An apparatus comprising:
a via layer, including a dielectric, between a substrate and a metal layer; and
an interconnect included in the via layer and coupled to the metal layer;
wherein:
the interconnect includes copper and a barrier layer that separates the copper from the dielectric;
the barrier layer is (a) on a first sidewall of the interconnect at a horizontal thickness, and (b) along a bottom of the interconnect at a vertical thickness that is greater than the horizontal thickness; and
the barrier layer includes an alloy including Tantalum and an element that includes at least one of Niobium, Tungsten, or Molybdenum.

15. The apparatus of claim 14, wherein both the tantalum and the element have a body centered cubic (BCC) crystal structure.

16. The apparatus of claim 15, wherein the barrier layer is sputtered within the interconnect.

17. The apparatus of claim 15, wherein the alloy includes at least 5% niobium.

18. The apparatus of claim 15, wherein:
the interconnect includes a trench formed directly over a via;
the first sidewall is included completely within the via;
the bottom of the interconnect is included within the via.

* * * * *